United States Patent [19]
Evans, Jr. et al.

[11] Patent Number: 5,578,846
[45] Date of Patent: Nov. 26, 1996

[54] STATIC FERROELECTRIC MEMORY TRANSISTOR HAVING IMPROVED DATA RETENTION

[76] Inventors: Joseph T. Evans, Jr., 13609 Verbena Pl., N.E.; William L. Warren, 7716 Wm. Moyers Ave., NE.; Bruce A. Tuttle, 12808 Lillian Pl., NE., all of Albuquerque, N.M. 87112

[21] Appl. No.: 406,386

[22] Filed: Mar. 17, 1995

[51] Int. Cl.$^6$ .................................................. H01L 29/78
[52] U.S. Cl. .......................................... 257/295; 257/532
[58] Field of Search ..................................... 257/295, 296, 257/298, 532

[56] References Cited

U.S. PATENT DOCUMENTS

| | | | |
|---|---|---|---|
| 2,791,760 | 5/1957 | Ross | 257/295 |
| 5,116,643 | 5/1992 | Miller et al. | 427/126.3 |
| 5,155,658 | 10/1992 | Inam et al. | 361/321 |
| 5,198,269 | 3/1993 | Swartz et al. | 427/226 |
| 5,198,994 | 3/1993 | Natori | 257/295 |
| 5,248,564 | 9/1993 | Ramesh | 428/688 |
| 5,303,182 | 4/1994 | Nakao et al. | 257/295 |
| 5,365,094 | 11/1994 | Takaso | 257/295 |
| 5,372,859 | 12/1994 | Thakoor | 427/551 |
| 5,406,445 | 4/1995 | Fujii et al. | 257/295 |
| 5,418,389 | 5/1995 | Watanabe | 257/295 |

FOREIGN PATENT DOCUMENTS

| 0046680 | 3/1983 | Japan | 257/295 |
|---|---|---|---|

OTHER PUBLICATIONS

Lines, M. E., and A. M. Glass. *Principles and Applications of Ferroelectric and Related Materials*. Oxford: Clarendon. 1977. pp. 241–242 & pp. 620–632.

Smolenskii. G. A. ed. *Ferroelectrics and Related Materials*. New York: Gordon and Breach, 1984. pp. 670–733.

Primary Examiner—Robert P. Limanek
Assistant Examiner—David B. Hardy
Attorney, Agent, or Firm—Calvin B. Ward

[57] ABSTRACT

An improved ferroelectric FET structure in which the ferroelectric layer is doped to reduce retention loss. A ferroelectric FET according to the present invention includes a semiconductor layer having first and second contacts thereon, the first and second contacts being separated from one another. The ferroelectric FET also includes a bottom electrode and a ferroelectric layer which is sandwiched between the semiconductor layer and the bottom electrode. The ferroelectric layer is constructed from a perovskite structure of the chemical composition $ABO_3$ wherein the B site comprises first and second elements and a dopant element that has an oxidation state greater than +4 in sufficient concentration to impede shifts in the resistance measured between the first and second contacts with time. The ferroelectric FET structure preferably comprises Pb in the A-site. The first and second elements are preferably Zr and Ti, respectively. The preferred B-site dopants are Niobium, Tantalum, and Tungsten at concentrations between 1% and 8%.

3 Claims, 3 Drawing Sheets

STATIC FERROELECTRIC MEMORY TRANSISTOR HAVING IMPROVED DATA RETENTION

FIELD OF THE INVENTION

The present invention relates to computer memories and more particularly, to computer memories based on ferroelectric thin films.

BACKGROUND OF THE INVENTION

Computer memories may be conveniently classified in terms of whether or not the memory retains the information stored therein when power is removed from the memory. Conventional DRAMs and SRAMs are examples of memories that lose their contents when power is removed. EEPROM and flash RAM are examples of non-volatile memories. The cost of non-volatile memories per bit remains sufficiently high to discourage their use in many applications. In addition, the underlying memory structures may only be written a relatively small number of times compared to volatile memories. For example, an EEPROM memory cell can only be written approximately $10^4$ times. In addition, the time required to write data into an EEPROM is many longer than that required to write volatile memories. Hence, the use of EEPROM cells is limited to a relatively limited class of applications.

One class of non-volatile memory that holds the potential for providing increased write cycles and faster writes is based on the ferroelectric thin films. These memories may divided into two types, those based on capacitors having ferroelectric dielectrics and those based on a structure analogous to a FET in which the gate oxide is replaced by a ferroelectric. The capacitor-like memories are based on a capacitor having a ferroelectric dielectric which may be polarized in one of two directions. The direction of polarization is used to store information, a "1" corresponding to one direction of polarization and a "0" corresponding to the other direction of polarization. The polarization of the dielectric is maintained when power is removed from the system, thus providing non-volatile operation. The memory is read by applying a potential in a direction that polarizes the memory in one of the two states and then detecting any current that flows during this programming cycle. A current flow is indicative of the capacitor having been in the opposite polarization state prior to the read pulse. In this case, the memory must be re-written after the read, since the read pulse will have changed the state of the capacitor. Hence, this type of memory cell is often referred to as a destructively read-out memory cell (DRO). While DRO memories may be written many more times than conventional EEPROM memories, commercial realizations of this type of memory have been limited by a number of factors including imprint and speed.

Memory cells based on the analog of the conventional field effect transistor hold the promise of avoiding the limitations of the DRO type devices. This type of memory may be viewed as a ferroelectric capacitor in which the top plate is replaced by a semiconducting material having two electrodes affixed thereto. The conductivity of the semiconducting layer depends on the direction of polarization of the ferroelectric dielectric layer. In one direction of polarization, the remanent field depletes the semiconducting layer of carriers leading to a high resistivity state for the layer. In the other direction of polarization, the semiconductor layer is in a low resistivity state. By placing a small potential difference across the electrodes on the semiconducting layer, the resistivity of the layer may be measured. Since this read operation does not change the polarization of the dielectric layer, these devices are referred to as non-destructively read-out memories (NDRO memories). Since the state of the dielectric does not change during read, these memories can be read faster and require lower power than the DRO memories. These memories also avoid the imprint problems that have blocked the commercialization of DRO memories.

The NDRO devices, however, have a lower information retention time than EEPROM's which typically retain their information for a period of 10 years. The prior art NDRO devices, in contrast, have been limited to a retention time of the order of 1 year.

Broadly, it is the object of the present invention to provide an improved NDRO memory device based on a ferroelectric FET.

It is a further object of the present invention to provide a ferroelectric FET memory cell that retains its information significantly longer than prior art ferroelectric FET memory cells.

These and other objects of the present invention will become apparent to those skilled in the art from the following detailed description of the invention and the accompanying drawings.

SUMMARY OF THE INVENTION

The present invention is an improved ferroelectric FET structure in which the ferroelectric layer is doped to reduce retention loss. A ferroelectric FET according to the present invention includes a semiconductor layer having first and second contacts thereon, the first and second contacts being separated from one another. The ferroelectric FET also includes a bottom electrode and a ferroelectric layer which is sandwiched between the semiconductor layer and the bottom electrode. The ferroelectric layer is constructed from a perovskite structure of the chemical composition $ABO_3$ wherein the B site comprises first and second elements and a dopant element that has an oxidation state greater than +4 in sufficient concentration to impede shifts in the resistance measured between the first and second contacts with time. The ferroelectric FET structure preferably comprises Pb in the A-site. The first and second elements are preferably Zr and Ti, respectively. The preferred B-site dopants are Niobium, Tantalum, and Tungsten at concentrations between 1% and 8%.

DETAILED DESCRIPTION OF THE INVENTION

Figure 1:
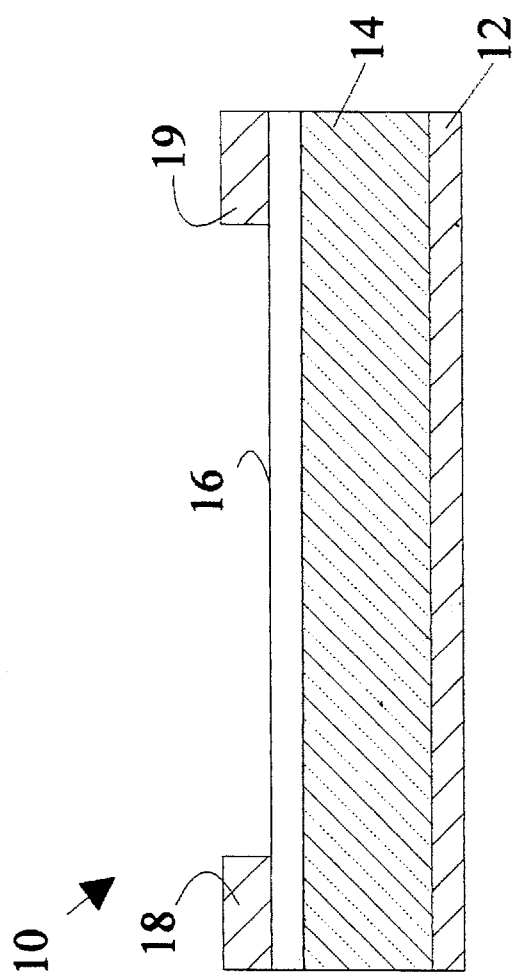
FIG. 1 is a cross-sectional view of a ferroelectric FET according to the present invention.

The present invention may be more easily understood with reference to FIG. 1 which is a cross-sectional view of a ferroelectric FET 10 according to the present invention. Ferroelectric FET 10 has a bottom electrode 12 which is typically constructed from platinum. A ferroelectric layer 14 is deposited on bottom electrode 12 and sintered in place. A semiconductor layer 16 is then deposited on ferroelectric layer 14. Two contacts, 18 and 19, are then deposited on semiconductor layer 14.

Ferroelectric FET 10 may be programmed by a number of different methods; however, for the purposes of the present discussion it will be assumed that electrodes 18 and 19 are both held at the same potential during the programming cycle. In this case, ferroelectric layer 14 may be programmed with the remanent polarization vector pointing toward electrode 12 by connecting electrodes 18 and 19 to $V_1$ and bottom electrode 12 to $V_2$ where $V_1 > V_2 + V_c$. Here, $V_c$ is the coercive voltage of ferroelectric layer 14. Ferroelectric layer 14 can be polarized in the opposite direction by reversing the voltages.

If an n-type semiconductor is used, the semiconductor layer will be depleted of carriers when the remanent polarization vector of ferroelectric layer 14 points away from bottom electrode 12. In this state, the resistance measured between contacts 18 and 19 will be much higher than that measured between these contacts when the ferroelectric layer is polarized in the opposite direction. It is this difference in resistance that is used to sense the state of polarization of ferroelectric layer 14 in memory applications.

The preferred material for constructing ferroelectric layer 14 is lead zironate titanate (PZT). The layer is deposited so as to form a perovskite structure. The simple perovskite structure is a cubic unit cell. A large cation (A) occupies the corners of the cube, a smaller cation (B) occupies the body center position, and oxygen ions occupy the center of the faces of the unit cell. A generalized chemical formula for this structure is conventionally represented by $ABO_3$. For PZT materials, the A-site is typically occupied by lead, and the B-site is typically occupied by zirconium or titanium. Capacitors with PZT as the dielectric will be referred to as PZT capacitors.

As noted above, conventional PZT ferroelectric FETs suffer from a loss of retention over time. To simplify the following discussion, a ferroelectric FET will be said to be in the high resistance state when the polarization of the ferroelectric layer is such that the semiconductor layer in the ferroelectric FET is depleted of carriers. The ferroelectric FET will be said to be in the low resistance state when the polarization of the ferroelectric layer is such that the semiconductor layer is in its most conductive state. It is observed experimentally that the resistance of the semiconductor layer decreases with time if the ferroelectric FET is programmed to be in the high resistance state, and the resistance of the ferroelectric FET increases with time if the ferroelectric FET is programmed to be in the low resistance state. The decrease in the high resistance state is typically more pronounced than the increase in the resistance of the low resistance state. In any case, after a sufficient time period has elapsed since the ferroelectric FET was programmed, it becomes impossible to distinguish the two states with the degree of certainty required to implement a computer memory.

It should be noted that the point at which the low and high resistance states become indistinguishable, and hence, the memory cell loses its data, depends on the temperature at which the ferroelectric FET is held after programming. This observation provides a means for determining the degree of retention loss for any given ferroelectric FET design to be estimated without the need to wait for a time period that would be years in the absence of the temperature stress. In general, a ferroelectric FET to be tested is polarized and then subsequently held at a temperature that is less than the Curie point of the ferroelectric material. The resistance of the ferroelectric layer is then measured at various times by placing a small potential difference across contacts 18 and 19 and measuring the current that flows between the contacts. The potentials used are too small to cause a significant change in the polarization of the ferroelectric layer.

Figure 2:
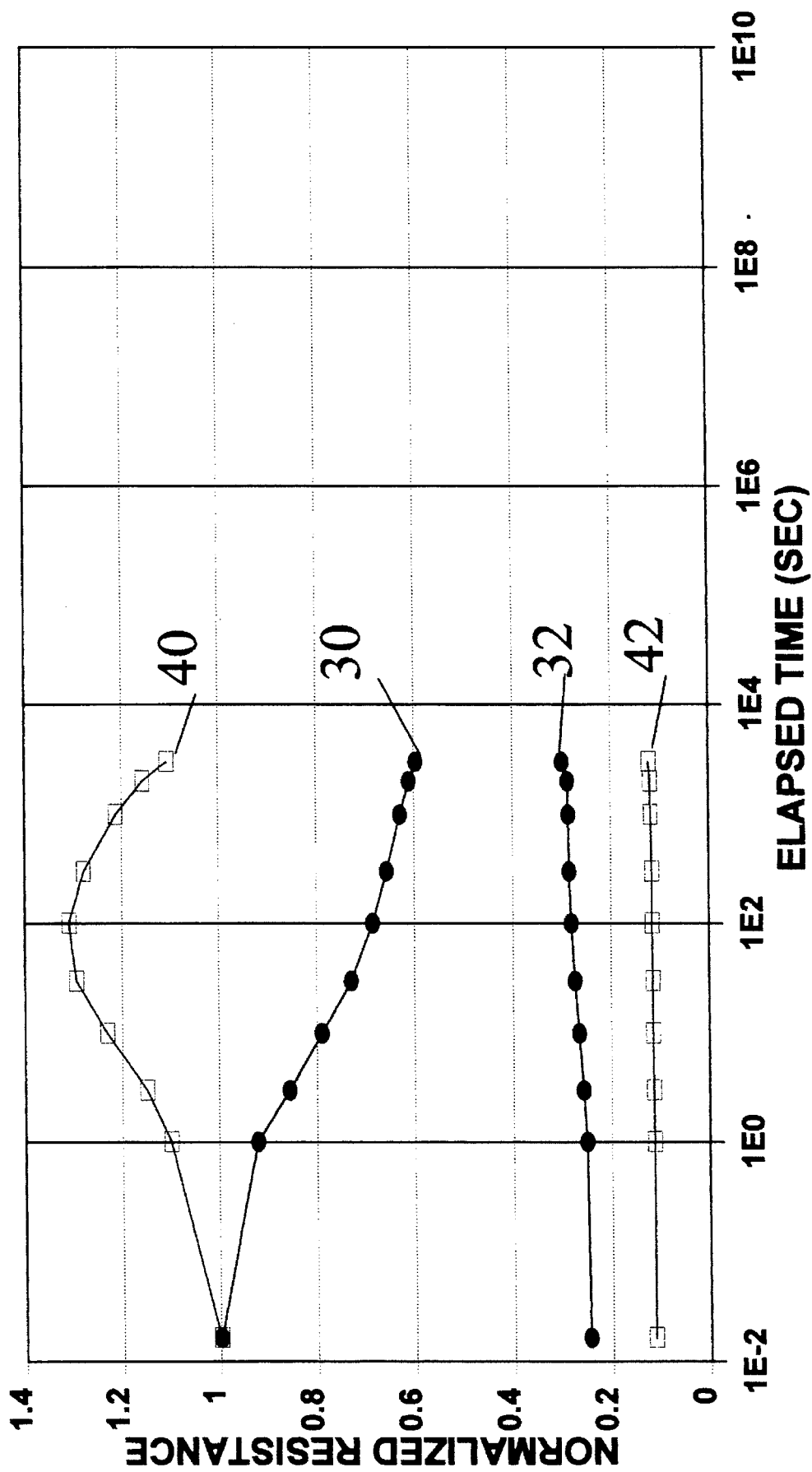
FIG. 2 is a linear-log plot of the resistance of two ferroelectric FETs as a function of time at room temperature.

The present invention is based on the experimental observation that the inclusion of a dopant element that occupies a portion of the B-sites and has an oxidation state greater than +4 reduces the retention loss relative to that observed in ferroelectric FETs in which the ferroelectric layer was not doped. Refer now to FIG. 2 which is a linear-log plot of the normalized resistance of two ferroelectric FETs as a function of time at room temperature. The resistance of the high and low states of a conventional ferroelectric FET are shown at 30 and 32, respectively. As can be seen from these curves, the resistance of the high state decreases with time and that of the low state increases with time.

Refer now to curves 40 and 42 which are the resistivities of the high and low resistance states for a ferroelectric FET in which 3.8% of the B sites are filled with Nb which is a dopant having an oxidation state greater than +4. It will be apparent from the figure that the loss of retention observed with the doped ferroelectric layer is substantially less than observed with the undopped layer.

Figure 3:
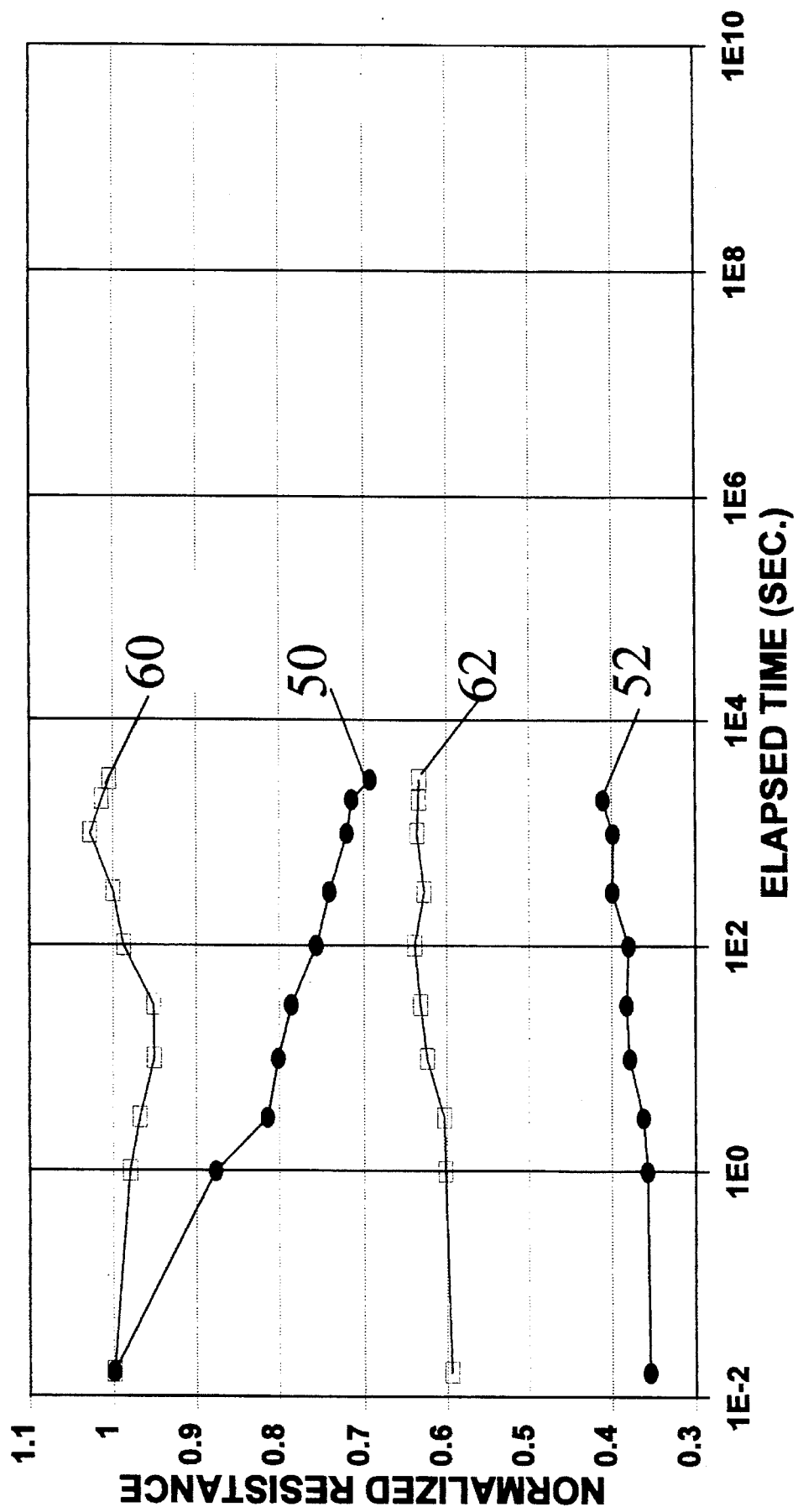
FIG. 3 is a linear-log plot of the resistance of two ferroelectric FETs as a function of time at 70° C.

The observed differences are even more apparent when the ferroelectric FETs are held at an elevated temperature. Refer now to FIG. 3 which is a linear-log plot of the normalized resistance of two ferroelectric FETs as a function of time when held at 70° C. The resistance of the high and low states of a conventional ferroelectric FET are shown at 50 and 52, respectively. As can be seen from these curves, the resistance of the high state decreases rapidly with time and that of the low state increases slowly with time. In contrast, the resistances of the high and low states of the doped ferroelectric FET remain almost constant with time. The high and low resistivity states of the doped ferroelectric FET are shown at 60 and 62, respectively.

Other dopants having an oxidation state greater than +4 may also be utilized. For example, Tantalum, and Tungsten may be utilized as dopants in place of Niobium.

The optimum level of dopant depends on a number of factors. While the level of retention improves with the inclusion of the dopant, these dopants lower the Curie point of the ferroelectric material. If the Curie point is too close to the operating temperature of the ferroelectric FET, the remanent polarization will decrease with time, thereby leading to memory loss of a different form.

In practice, it has been found that the preferred doping concentrations are those that result in 1% to 8% of the B-sites being filled by the dopant. At concentrations below 1%, there is insufficient improvement in retention. At higher dopant concentrations, the problems discussed above limit the performance of the ferroelectric FETs. However, it will be apparent to those skilled in the art that other dopant levels may be advantageous in situations in which the operating temperature or other parameters discussed above allow higher dopant levels to be advantageously utilized.

Various modifications to the present invention will become apparent to those skilled in the art from the foregoing description and accompanying drawings. Accordingly, the present invention is to be limited solely by the scope of the following claims.

What is claimed is:

1. An improved ferroelectric FET structure comprising:
   a semiconductor layer having first and second contacts thereon, said first and second contacts being separated from one another;

a bottom electrode; and a ferroelectric layer sandwiched between said semiconductor layer and said bottom electrode, said ferroelectric layer comprising a perovskite structure having A and B sites and having a chemical composition $ABO_3$ wherein said B-sites are filled with a first element, a second element, or a dopant element that has an oxidation state greater than +4, said dopant element being present in said ferroelectric layer in sufficient concentration to impede shifts in the resistance measured between the first and second contacts with time, wherein said all of said first, second and dopant elements are present in said ferroelectric layer, wherein said ferroelectric comprises Pb in said A-site, and wherein said first and second elements are Zr and Ti, respectively.

2. The ferroelectric FET structure of claim 1 wherein said dopant element is chosen from the group consisting of Niobium, Tantalum, and Tungsten.

3. The ferroelectric FET structure of claim 1 wherein said dopant element occupies between 1% and 8% of said B-sites.

* * * * *

UNITED STATES PATENT AND TRADEMARK OFFICE
CERTIFICATE OF CORRECTION

PATENT NO. : 5,578,846
DATED : 11/26/96
INVENTOR(S) : Evans, et al.

It is certified that error appears in the above-identified patent and that said Letters Patent is hereby corrected as shown below:

AS FIRST PARAGRAPH: add "This invention was made with Government support under Contract No. DE-AC04-94AL85000 awared by the U.S. Department of Energy. The Government has certain rights in this invention."

Signed and Sealed this

Thirtieth Day of June, 1998

Attest:

BRUCE LEHMAN

*Attesting Officer*   *Commissioner of Patents and Trademarks*